United States Patent [19]

Miyake

[11] Patent Number: 5,424,920
[45] Date of Patent: Jun. 13, 1995

[54] NON-CONDUCTIVE END LAYER FOR INTEGRATED STACK OF IC CHIPS

[75] Inventor: Michael K. Miyake, Westminster, Calif.

[73] Assignee: Irvine Sensors Corporation, Costa Mesa, Calif.

[21] Appl. No.: 232,739

[22] Filed: Apr. 25, 1994

Related U.S. Application Data

[63] Continuation-in-part of Ser. No. 884,660, May 15, 1992, abandoned.

[51] Int. Cl.[6] ............................................. H05K 7/00
[52] U.S. Cl. .................................. 361/735; 361/744; 361/792; 257/686; 257/704; 257/777
[58] Field of Search .................. 361/728–730, 361/735, 744, 784–785, 792, 796; 29/846, 852, 592.1, 845; 437/51, 208, 205, 915; 257/685–686, 704, 777

[56] References Cited

U.S. PATENT DOCUMENTS 2,907,926 10/1959 Slack .
4,794,092 12/1988 Solomon ................................ 437/51
4,953,005 8/1990 Carlson et al. .
5,104,820 4/1992 Go ..................................... 174/52.4

FOREIGN PATENT DOCUMENTS 0217644 1/1990 Japan .

Primary Examiner—Bot Ledynh
Attorney, Agent, or Firm—Thomas J. Plante

[57] ABSTRACT

An integrated stack of layers incorporating a plurality of IC chip layers has an end layer which is formed of dielectric material (or covered with such material). The outer surface of the end layer provides a substantial area for the spaced location of a multiplicity of lead-out terminals, to which exterior circuitry can be readily connected. In the preferred embodiment, each lead-out terminal on the outer surface of the end layer is connected to IC circuitry embedded in the stack by means of conducting material in a hole through the end layer, and a conductor (trace) on the inner surface of the end layer which extends from the hole to the edge of the end layer, where it is connected by a T-connect to metalization on the access plane face of the stack.

20 Claims, 6 Drawing Sheets

NON-CONDUCTIVE END LAYER FOR INTEGRATED STACK OF IC CHIPS

This application is a continuation-in-part of application Ser. No. 07/884,660, filed May 15, 1992 now abandoned.

The invention of the parent application was made with Government support under Prime Contract F29601-89-C-0014, Subcontract SC-0014-89-0017, awarded by the Department of the Air Force. The Government has certain rights in the invention.

BACKGROUND OF THE INVENTION

This invention relates to the fabrication of three-dimensional electronic packages in which a multiplicity of individual integrated circuit (IC) chips are secured together in a stack which provides a very high density electronic package.

As stated in common assignee U.S. Pat. No. 5.279.991, issued Jan. 18, 1994, which provides more detailed disclosure of certain process steps, the assignee of this application pioneered the use of IC chip stacks, first as modules providing photo-detector focal plane circuitry, and then as units suitable for computer memories and the like. U.S. Pat. Nos. 4,525,921 and 4,646,128 relate to the stacks designed for general use as memory devices and other non-focal-plane packages.

The methods used for fabricating such three dimensional (3D) IC chip stacks have become increasingly sophisticated. The three dimensional approach has been applied to both SRAM and DRAM memory chips with satisfactory results. Stacking of memory chips has reached density levels of seventy chips in a 0.220 inch$\times$0.520 inch$\times$0.520 inch stack, each chip having a 1 megabit memory. In addition to memory chips, various other types of IC chips may be stacked in 3-D packages.

One problem, which applies to stacks used as memory devices and also to other non-focal-plane packages, is the difficulty of connecting exterior circuitry to the large number of conductors on the access plane of the completed stack. Focal plane chip stack modules incorporate multiplexer circuitry, which greatly reduces the number of module output connections. However, providing output connections for memory devices, and offer non-multiplexed devices, is a much greater challenge.

There are two acknowledged orientations which represent the structural relationship of the stacked IC chips in a module to the lead-out plate, or substrate, which makes outside electrical circuitry available for connection to the multiplicity of electrical leads (terminals) which are formed on the access plane face of the module, and which lead to the IC circuitry embedded in the module. In one arrangement, the layers of the module extend in planes perpendicular to the plane of the lead-out plate, or substrate. And in the other arrangement, the layers of the module extend in planes parallel to the plane of the lead-out plate, or substrate.

The lead-out plates, or substrates, may be located below, above, or along the side of, the stacked chip module. The two most common structures are described as a "sliced bread" stack, or as a "pancake" stack. Common assignee U.S. Pat. No. 4,706,166 discloses a "sliced bread" stack, in which the IC chips in the stacked module are in planes perpendicular to a stack-supporting substrate. The substrate carries electrical conductors, which lead to external circuitry. The access plane of the stack faces the supporting substrate. And the electrical connections between the stack face and substrate are formed by bonding aligned solder bumps on the facing surfaces, a process which may be referred to as surface mount technology. In such a construction, the lead-out terminals are necessarily located very close to one another, a fact which creates difficulties in obtaining satisfactory lead-out connections.

"Pancake" stacks comprise IC chips which are in planes parallel to a supporting substrate. The electrical leads from the many terminals on the access plane of the stack preferably are brought either to the bottom or to the top of the stack, in order to be connected to external circuitry. Such "pancake" stacks are disclosed in copending common assignee U.S. Pat. No. 5,279,991. "Pancake" stacks, as distinguished from "sliced bread" stacks, are more likely to be used where a smaller number of IC chips are included in the stacked layer module, either because fewer chips are needed for a particular module, or because of limited "headroom" i e limited available space in which the module is located.

The present invention deals primarily with the problem of connecting the circuitry of IC chips in pancake stacks with suitable lead-out terminals, which are then used in connecting to external circuitry.

SUMMARY OF THE INVENTION

This invention utilizes an insulated end, or cap, layer, which is an integral part of the stack, and which provides means for interconnecting the circuitry inside the stack with exterior circuitry. A significant result of this invention is a major increase in the real estate available for locating lead-out terminals.

The outer (exposed) surface of the cap layer has numerous terminals available for connection, by wire bonding or other suitable means, to exterior circuitry, e.g., circuitry on a stack-supporting substrate. The terminals on the outer surface of the cap are connected to the IC circuitry embedded in the stack by suitable conductors, e.g., electrically parallel metallic leads.

The signals from the IC chips in the stack are conveyed to the cap layer, using the access plane of the stack as the location for signal-transferring metalization. The access plane is formed by the aligned edges of the stacked chips. More than one access plane may be used.

The common assignee patents referred to above disclose the access plane concept. Where a cap layer is used to enlarge the real estate available for terminals, various means may be used to convey the signals from the embedded IC chip circuitry to the access plane, then along the access plane to the cap layer, and finally parallel to the plane of the cap layer to reach the cap layer terminals.

At present, the most developmentally advanced signal-carrying arrangement: (1) applies metal conductors (traces) to the inner (non-exposed) side of the cap layer, such conductors leading from the access plane; and (2) connects the inner ends of such conductors (traces) to metal conductors which extend through vias (holes) in the cap layer to lead toward the terminals on its outer surface.

Experimentation has demonstrated that, for reasons explained below, the preferred conductors extending through the cap layer holes are conductors which fill the holes. However, hollow conductors may be used, comprising metal which adheres to the sides of the holes.

Although the underside of the cap layer has heretofore been the location of the access plane-to-terminal metallic leads, it is also feasible to embed such leads in the material of the cap layer, or to use leads which, in effect, "wrap around" the outer edge of the cap layer. Another, probably more difficult, alternative is to locate the access plane-to-terminal leads on the top of the adjacent layer in the stack.

Since the cap layer may support many conductors, it must be insulated from them. At present, it is preferred to use a ceramic dielectric cap layer material, e.g., aluminum nitride, which has a coefficient of thermal expansion (CTE) similar to that of the semiconductor material which constitutes the IC chip layers of the stack. However, the cap layer material may be another dielectric, e.g., alumina, or it may be a conductive material, such as silicon, covered with insulating material. Another dielectric material usable to form a cap layer is a polyimide having a CTE in its X and Y axes which is comparable to that of the IC chips.

A single insulated cap layer may be used in a stack of chips. Only one such layer is required for providing lead-out terminals. However, it is often desirable to provide two insulated layers (top and bottom) of a stack, in order to facilitate the process of forming short stacks by segmenting a large stack.

DETAILED DESCRIPTION OF SPECIFIC EMBODIMENTS

The present invention is relevant to either large stacks of chips, or small stacks of chips. However, large stacks are more likely to be mounted in the "sliced bread" configuration than in the "pancake" configuration. Although small stacks might be individually fabricated, they normally will be fabricated by segmenting large stacks. The common assignee U.S. Pat. No. 5,279,491 is directed to the method of forming small stacks by creating a large stack, processing the access plane surface of the large stack, and then segmenting the large stack into a plurality of smaller stacks.

Figure 1:
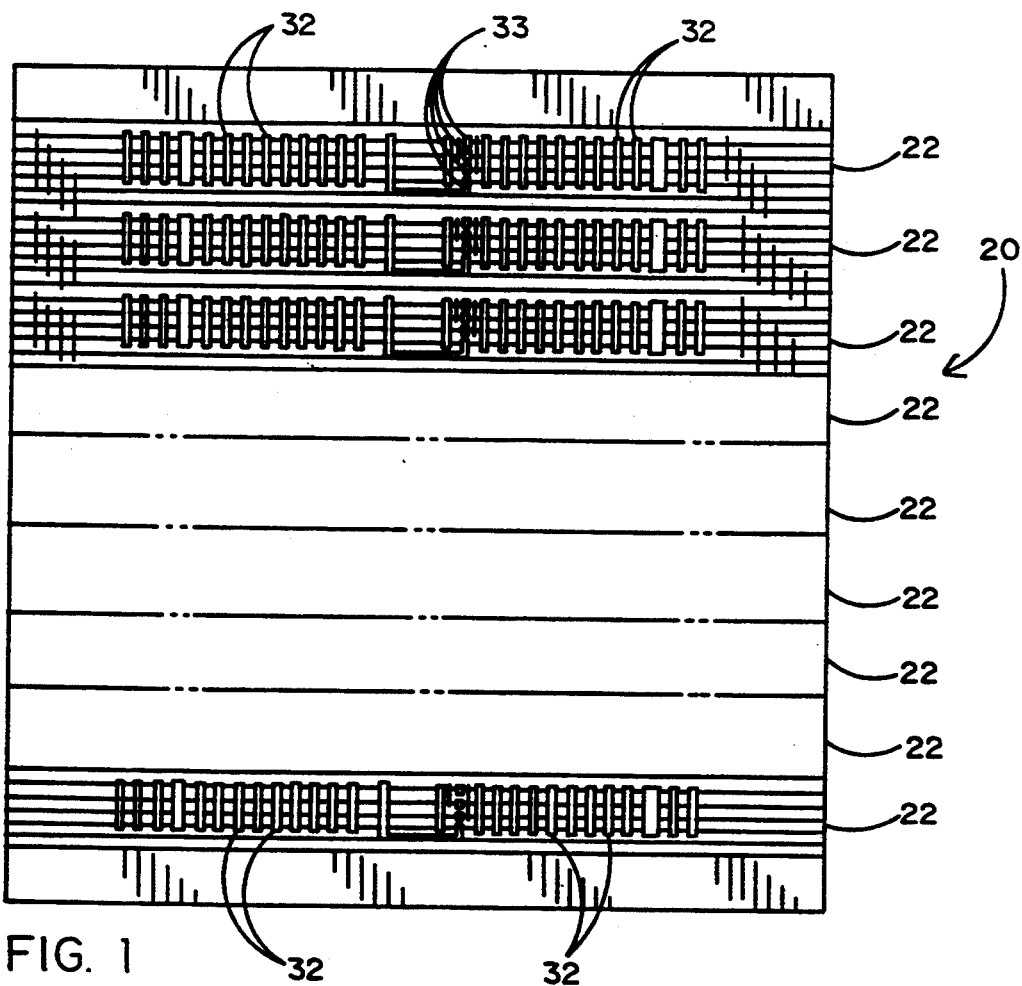
FIG. 1, which generally corresponds to FIG. 2 of the cross-referenced application Ser. No. 996,794, is a front view of the access plane of a large stack of layers, containing a plurality of small stacks, each of which includes a cap layer and a plurality of IC chip layers.

In FIG. 1, a large stack 20 has been prepared and processed, and is ready for segmentation. A separation tool is used on the large stack 20 to remove the short stack 22 shown in FIG. 2. The front plane of the stacks, as seen in FIGS. 1 and 2, is the access plane used for connection to external circuitry.

Figure 2:
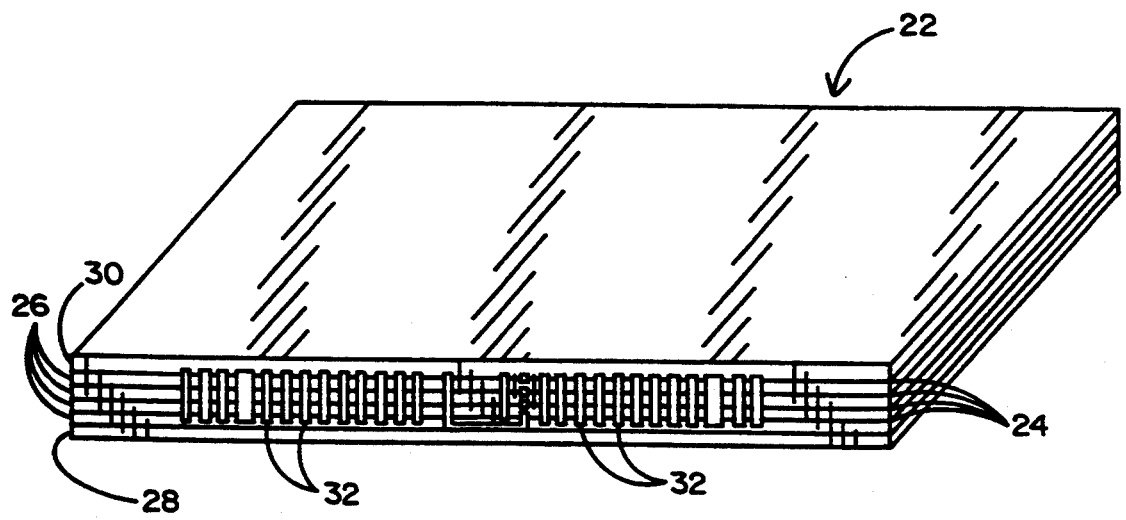
FIG. 2, which generally corresponds to FIG. 4 of the cross-referenced application, is an isometric view of a short stack, which has been separated from the large stack shown in FIG. 1.

The short stack in FIG. 2 has the shape of a rectangular parallelepiped. It contains four lead-carrying surfaces 24 formed on four active (IC) chip layers 26. Two inactive layers 28 and 30 are located at the bottom and top, respectively, of the short stack. Having at least one inactive layer: (a) allows the active layers to be isolated from exterior circuitry, except for the metalization formed on the access plane, and (b) permits T-connect engagement between each lead from the interior of the stack and metalization formed on the access plane of the stack. As stated above, having two inactive layers (top and bottom) facilitates the process of forming short stacks by segmenting a large stack.

The large stack 20 in FIG. 1 provides 9 short stacks 22, each having four active chips. The number of chips in the large stack and in the small stack can be varied to suit particular stack fabrication needs. It is assumed, however, that each of the multiple short stacks formed from a given large stack will normally be identical in size.

Figure 3:
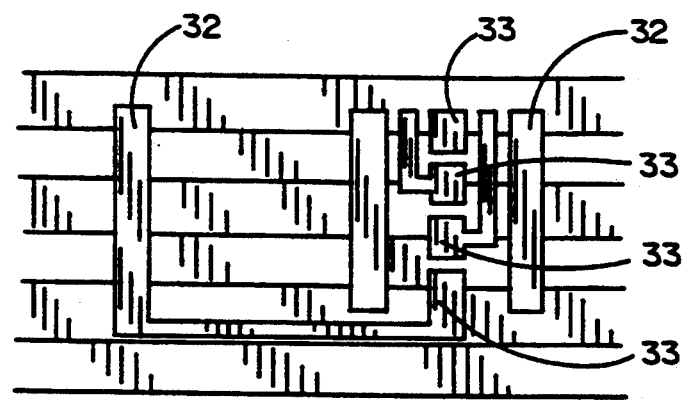
FIG. 3 is a close-up of the metalization at the center of the short stack in FIG. 2.

As seen in FIGS. 1 and 2, the access plane of the large and small stacks has electrically conductive metalization formed thereon, in the form of numerous vertically extending buses 32, and pads 33 permitting separate access to each chip. These buses and pads are electrically connected to the circuitry embedded in the stacks, by means of a multiplicity of T-connects of the type disclosed in prior common assignee patents and applications. The term "T-connect" means that each flat lead coming from the IC portion of the layer to the layer edge is in electrical contact with a metal strip or pad which extends beyond the lead in both directions (both upwardly and downwardly in FIGS. 1-3). Experience has demonstrated the value of T-connects where the more common techniques of solder bonding are not feasible. Note that the T-connect metalization strips extend onto the lower portion of the top (inactive) layer 30.

Stacks of layers which include active IC chip layers, and also inactive end layers, are assembled in a stacking fixture, with a thin layer of adhesive placed between adjacent layers. The stacked layers and fixture are then placed in an oven and baked at the curing temperature for a given time. After lamination of the stack has been completed, the "face" (access plane) of the stack may be sanded and lapped, then plasma etched to expose the metal leads on each active chip. The leads may be of the order of 1 micrometer thick and 125 micrometers wide. After sufficient etching, several layers of polyimide may be deposited over the stack face, covering to a depth somewhat greater than the length of the exposed metal leads. This polyimide serves as a passivating layer between the silicon chips and the metal pads/buslines deposited later in the process. After curing the polyimide layers, the face (access plane) of the stack is thinly lapped to clear cured polyimide from the metal lead ends.

Using photolithography (either lift-off or etch-back) and sputter deposition of metal, the pads and buslines are formed on the stack face. The metal lead interconnects that are formed are preferably T-connects.

An alternative method of passivating the access plane face of the laminated stack is disclosed in a separate common assignee application Ser. No. 08/213,149, filed Mar. 15, 1994. That application discloses processing of the access plane which does not require etching of the silicon edges forming the access plane. Instead the access plane of the laminated stack is covered by passivation material, e.g., polyimide, and trenches, or vias, are formed through the passivation material to expose the metal leads on the access plane. The T-connects, pads and buslines are then formed.

In order to segment the large stack shown in FIG. 1 into a plurality of the small stacks shown in FIG. 2, means must be devised to divide the full stack into several short stacks. This has been accomplished using a thermoplastic adhesive on the plane between the short stacks, heating to the adhesive's softening temperature, and applying a shear force to slide one short stack off another. The adhesive bonding of the layers within the short stack is of course still rigid and unaffected by the shear force.

In the short stack of FIG. 2, the four active chip layers 26 are usually formed of silicon, which is a semiconductor material. The inactive upper layer, or cap, 30 may be formed of a non-conducting (dielectric) material. If desired, the bottom layer 28 may also be formed of the same non-conducting (dielectric) material. The cap layer 30 could be formed of the same material as that of the IC chips, and then covered with insulating material. One advantage of such an insulation-covered silicon layer would be an identical coefficient of thermal expansion (CTE). However, present practice is to use a dielectric material as the cap layer 30, selecting a material which has a CTE similar to that of the IC chip material. Having similar CTE values is important in avoiding stresses due to temperature variations to which the stacked layer module is subjected.

The presently preferred material for cap layer 30 is aluminum nitride, which has a CTE of 4.6 ppm. This is close to the CTE of the semiconductor silicon, which is generally used as the IC chip material. The CTE of silicon is approximately 4.0 ppm. Aluminum nitride also provides good mechanical strength, and it is available in a satisfactory layer thickness.

Assuming the aluminum nitride (ceramic) cap layer is an integral part of the stacked layer module, it is necessary to pre-form that layer, and to pre-process the circuitry carried by that layer, before it is inserted into the stack, which thereafter is integrated and then subjected to various processing steps.

The interconnection between the internal short stack circuitry (IC chips) and the external circuitry is made by the cap layer 30. In the present practice, T-connects join the buses 32 and pads 33 to the lead lines (traces) formed on the inner surface of the cap layer.

Figure 4:
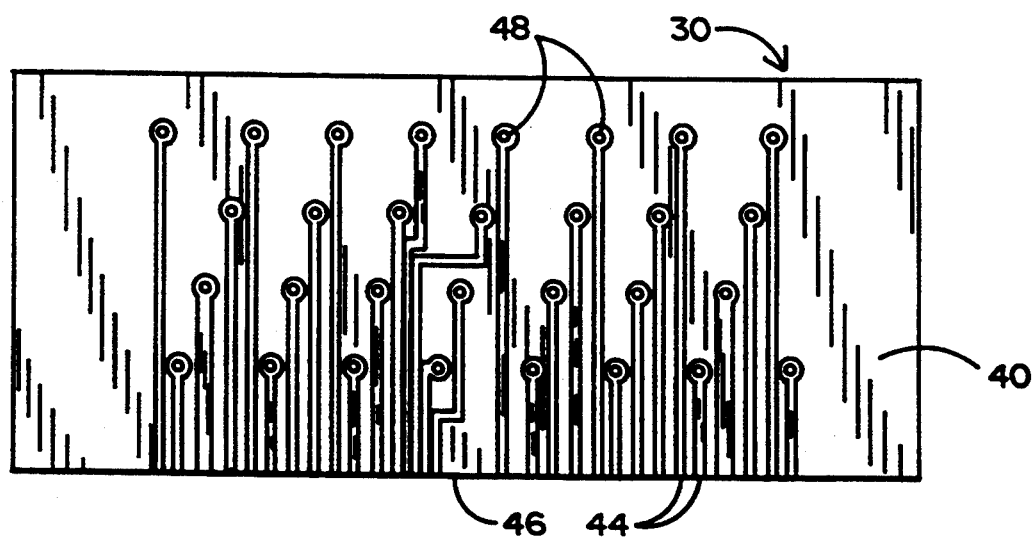
FIG. 4 is a plan view of the inner surface of the cap layer.
Figure 5:
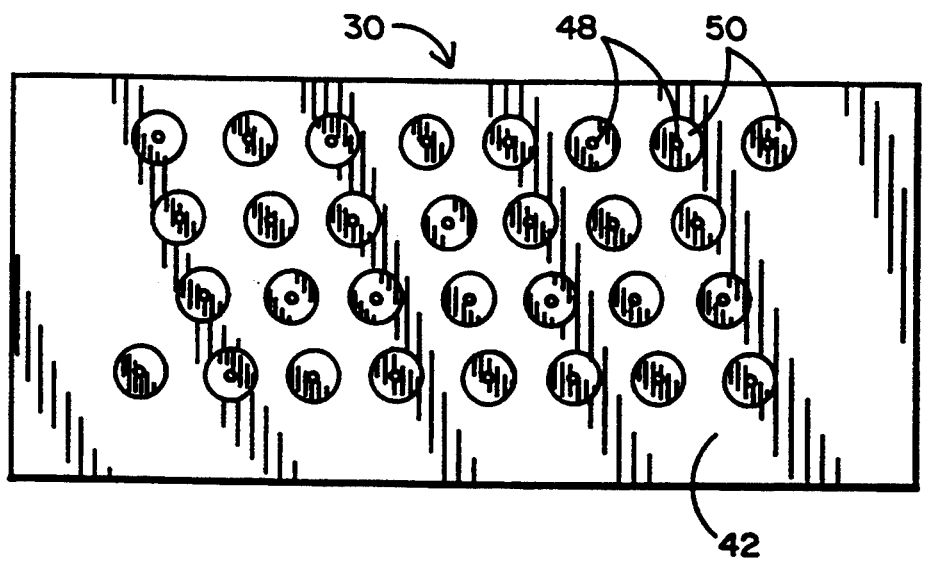
FIG. 5 is a plan view of the outer surface of the cap layer.

FIG. 4 shows the inner surface 40 of cap layer 30; and FIG. 5 shows the outer surface 42 of cap layer 30. Electrically parallel traces, or conductors, 44 on inner surface 40 each extend from edge 46, where T-connects are formed, to one of the holes 48, which extend through to the outer surface 42. On outer surface 42, each hole 48 may be surrounded by, or next to, a terminal pad 50, which will be subsequently connected to exterior circuitry, e.g., by wire bonding.

A significant advantage of the present invention is the substantial increase in real estate available for the lead-out terminals 50. The entire area of outer surface 42 of layer 30 is available for spacing the locations of the terminals. This means that lead-out connections, such as wire bonds, can be readily formed, without risk of creating any short circuits. In the presently preferred embodiment, leads on the outer surface 42 connect to the multiplicity of terminals formed near the opposite edges of the cap layer.

Figure 6:
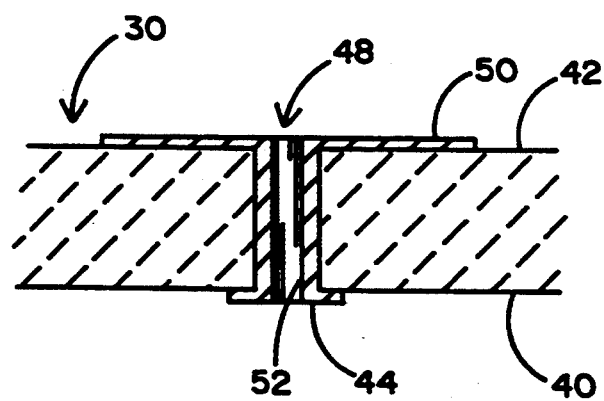
FIG. 6 is a cross-section through the cap layer showing metalization in the holes which extend through the cap layer.
Figure 7:
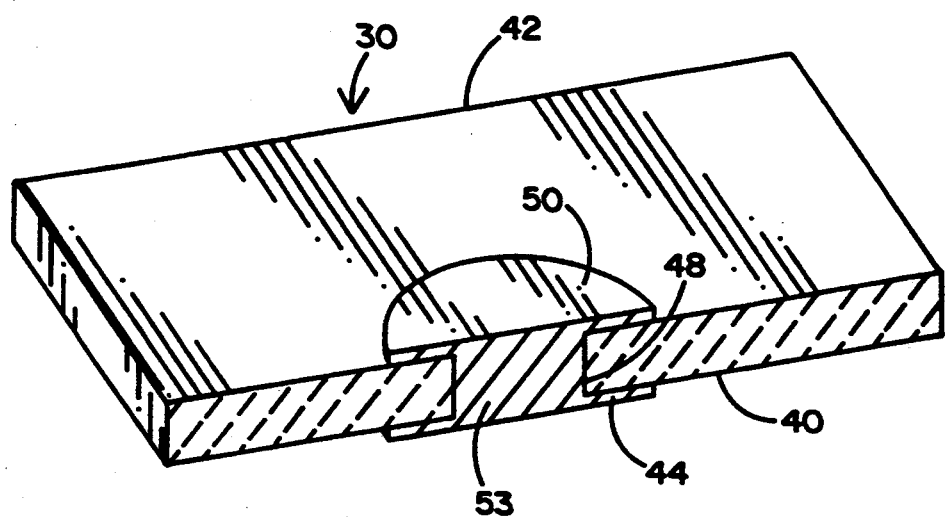
FIG. 7 is a cross-section similar to FIG. 6, but holes in the cap layer filled with metalization.

Conductive connections through the holes 48 are provided by material, preferably metal, which is suitably deposited in the holes. This material must maintain electrical continuity between traces 44 and the terminals on outer surface 50, regardless of thermal changes or other stresses. One method of providing the conductors 52 (see FIG. 6) which extend through the holes 48 is by deposition of a suitable metal on the inner walls of the holes. Under many circumstances, however, it is preferable to fill each hole with metallic conductor material, as shown by conductor 53 in FIG. 7.

A major advantage of filling the holes with metal is to prevent mixing of the adhesive materials on opposite sides of the cap layer. Because the outer surface of the cap layer engages the bottom layer of the next short stack, separation of a large stack into short stacks occurs by overcoming the adhesive on the outer surface of the cap layer. This adhesive may be referred to as a "sacrificial" adhesive, usually a thermoplastic material. It gives way under heat and the pressure of the separation tool, whereas the permanent adhesive within the short stack (e.g., thermosetting material) retains a strong adhesion.

The filling of the holes in the cap layers with metal prevents mixing of the adhesive materials on opposite sides of the cap layer. If the two adhesive materials are inadvertently mixed, by moving through the holes in the cap layer, the sacrificial adhesive may become permanent. That would interfere with stack separation.

Another advantage of filling the holes with metal is that it permits checking the electrical integrity of the connections by visual inspection.

Providing continuous electrical conduction from the access plane T-connects, along the traces 44, and along the conductors 52 in holes 48, to the exterior terminals, may be accomplished by any suitable method. One such method is electroplating. Assuming top layer 30 is formed of aluminum nitride (a ceramic), a preliminary "electroless" process must be performed, in order to form a very thin metallic "seeding" layer on the ceramic material. The seeded metal is then available as the cathode in an electroplating (electrolytic) process which is used to thicken the metal conductors to the desired extent. The traces 44, the metal conductors on the walls of holes 48, and the pads 50, may be simultaneously formed by the seeding and electroplating steps.

Another possible method for providing the continuous electrical conduction on and through layer 30 is metal sputtering. That process is feasible if the layer 30 is thin enough and if the holes 48 are large enough. Before sputtering on the primary conducting metal, such as gold or copper, an adhesion metal layer, such as titanium-tungsten would be sputtered on the dielectric surface.

If the holes 48 are to be filled with metal conductors 53, several different techniques may be used. One method involves filling the holes with melted aluminum. The cap layer would be placed in the melted aluminum. After cooling, the excess aluminum would be ground off the surfaces of the cap layer. Another method involves a first seeding layer, followed by a firing process using gold paste which provides a thick film metal. Another method involves a high temperature firing of tungsten with a ceramic. With any of the foregoing hole-filling processes, it is necessary subsequently to use thin film (or thick film) technology to form the conductors on the inner and outer surfaces of the cap layer.

Figure 8:
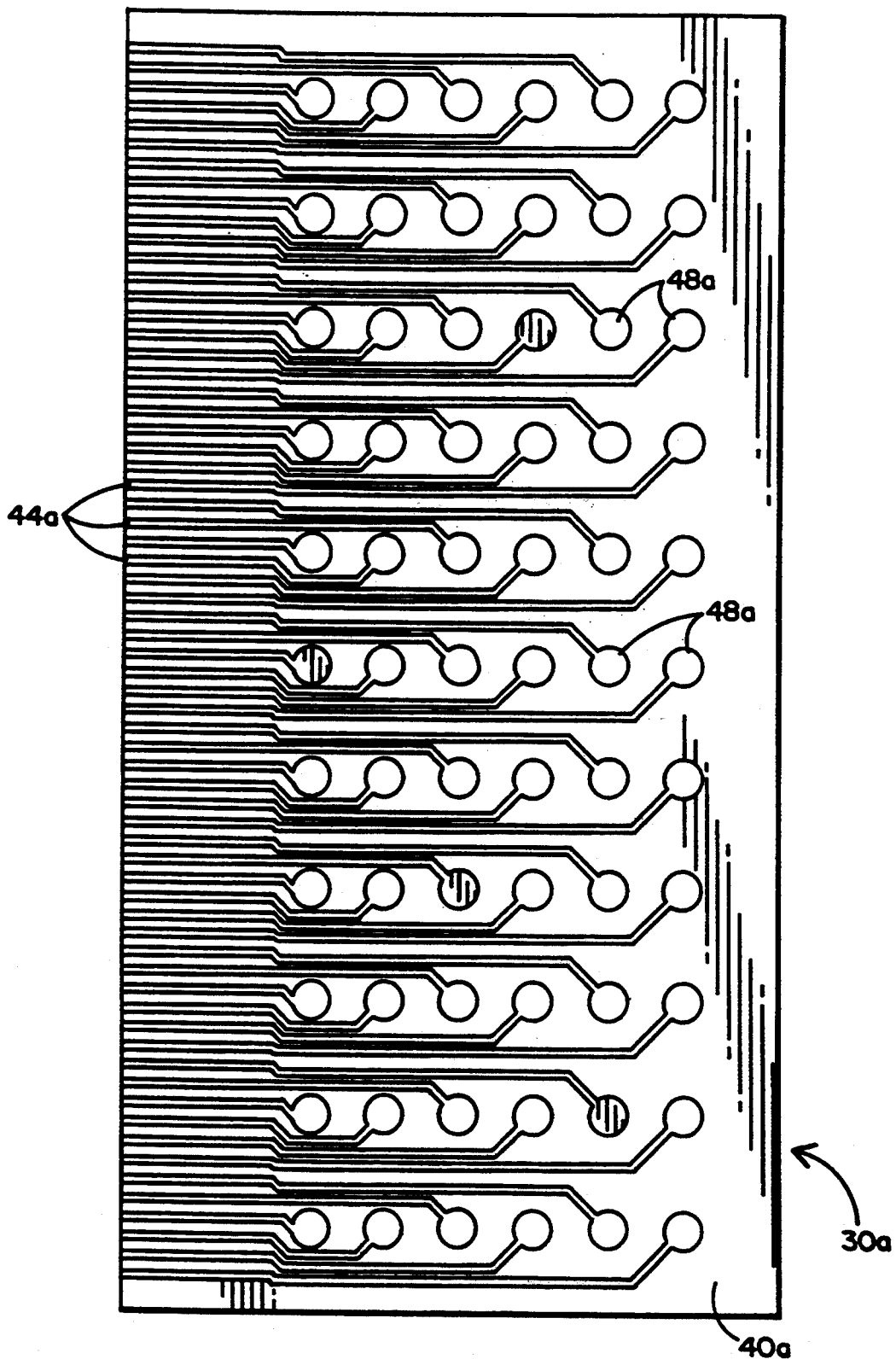
FIG. 8 is a plan view of the inner surface of a cap layer having a greater density of leads and terminals than FIG. 4.
Figure 9:
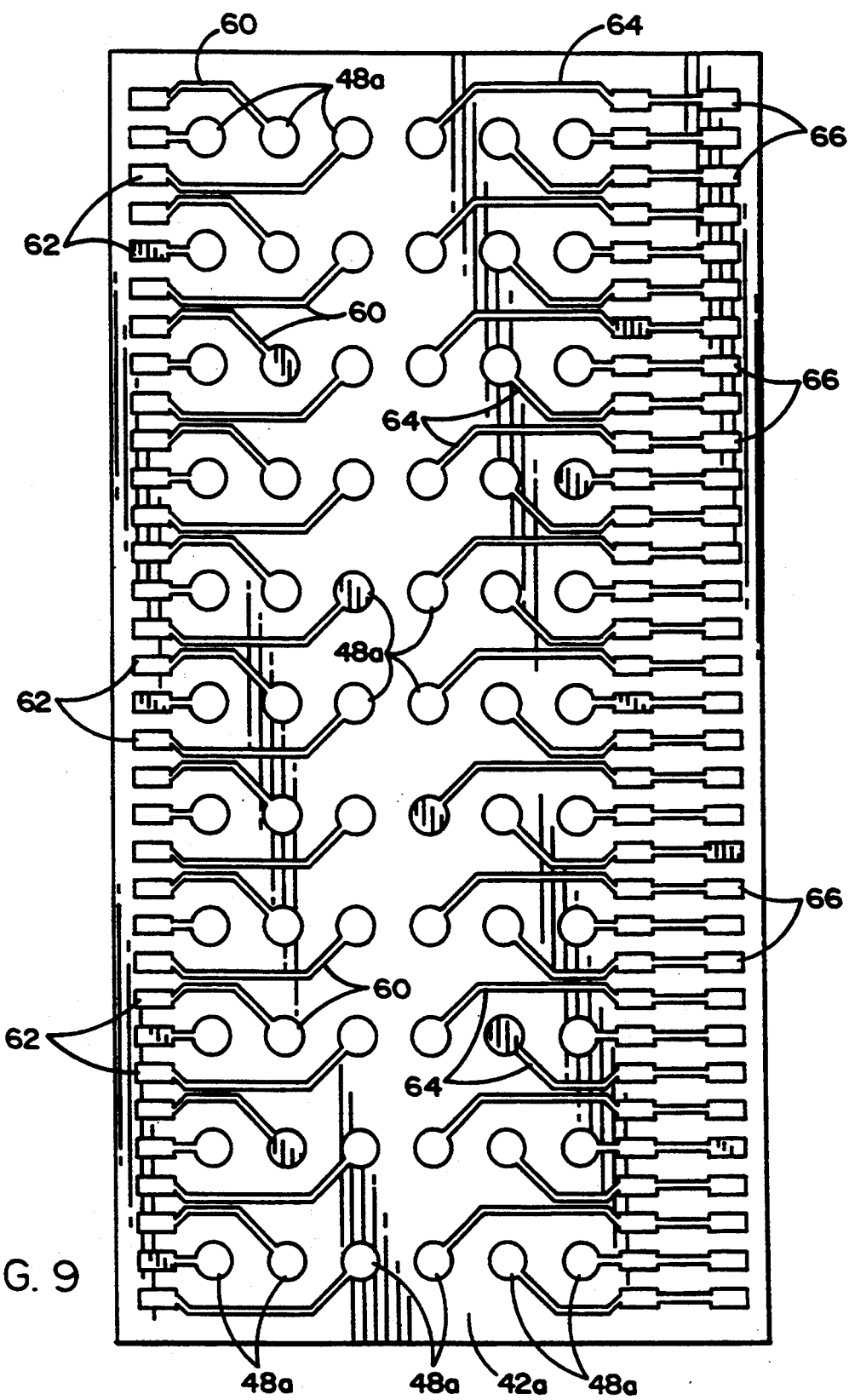
FIG. 9 is a plan view of the outer surface of the same cap layer as the one shown in FIG. 8.

FIGS. 8 and 9 show a preferred arrangement of the conductors and terminals on the opposite sides of the cap layer. The underside (inner surface) 40a of cap layer 30a, as shown in FIG. 8, has holes 48a which total 66, arranged in 11 columns and 6 rows. Conductive leads, or traces, 44a connect each hole 48a separately to the access plane edge of the cap layer, where they contact metalization on the access plane.

The outside (outer surface) 42a of cap layer 30a, as shown in FIG. 9, has the same holes 48a, but the terminals, which are available for connection to exterior circuitry, are located near the opposite edges of the cap layer. Half of the holes 48a are connected by conductors (traces) 60 to terminals 62 located near one edge of surface 42a; and half of the holes 48a are connected by conductors (traces) 64 to terminals 66 located near the opposite edge of surface 42a.

If the surface having the lead-out terminals (50, 62, 66) is exposed, as it is on the top of the pancake stack shown in FIG. 2, access of external circuitry to the pads 50 is easily obtained, e.g., by wire bonding. If external circuitry is to be connected at the bottom of the stack, surface mount technology, such as direct solder bonding, may be used, similar to that of U.S. Pat. No. 4,706,166. Lead-out conductors could be provided at both the top and bottom cap layers. Forming lead-out terminals on the non-exposed end surface of the stack would have the same real estate advantage as forming such terminals on the exposed surface.

Even where the exterior circuitry access is solely at the top of the stack, it may be desirable to use a ceramic layer also as the bottom layer of the stacked chip module. One of the process steps which may be performed on the large stack (see U.S. Pat. No. 5,279,991) is etching to remove some silicon semiconductor material from the access plane, prior to passivating the access plane with a material such as polyimide. The silicon etching process does not significantly etch the aluminum nitride material. If aluminum nitride layers are located at both the top and bottom of each short stack, a symmetrical access plane surface will remain after the etching process. Another advantage results from the fact that separation of adjacent small stacks from a large stack would involve separation of layers formed of the same material. Separation is easier, and less likely to cause damage, when two adjacent end plates in the large stack are formed of the same material. However, an extra end layer increases the height of the stack. Also, ceramic end layers are thicker than the IC chips.

From the foregoing description, it will be apparent that the method and structure disclosed in this application will provide the significant functional benefits summarized in the introductory portion of the specification.

The following claims are intended not only to cover the specific embodiments disclosed, but also to cover the inventive concepts explained herein with the maximum breadth and comprehensiveness permitted by the prior art.

What is claimed is:

1. An integrated stack of layers which form a three-dimensional structure having an access plane, and containing embedded integrated circuitry (IC), comprising:

a plurality of layers which are IC chips, each IC chip having an edge forming part of the access plane, on which a multiplicity of electrical leads are accessible;

a cap layer at one end of the stack, which constitutes an insulating layer, and which has (a) a plurality of holes extending between its inner surface and its outer surface, and (b) a plurality of terminals at the access plane;

a plurality of traces next to the inner surface of the cap layer, each leading from one or more of the holes to one or more of the access plane terminals;

a plurality of cap layer terminals on the outer surface of the cap layer each leading to one or more of the holes;

conducting material extending through each hole to electrically connect the desired trace to the desired cap layer terminal; and conducting material on the access plane connecting each access plane terminal of the cap layer to one or more leads on one or more IC chips.

2. The integrated stack of layers of claim 1, in which the cap layer has a coefficient of thermal expansion similar to the coefficient of thermal expansion of the material which forms the IC chip layers.

3. The integrated stack of layers of claim 2, in which the material forming the IC chip layers is silicon, and the material forming the cap layer is aluminum nitride.

4. The integrated stack of layers of claim 1, which also comprises:

a second insulating layer, which is located at the other end of the stack from the cap layer, so that both ends of the stack are covered by insulating layers.

5. The integrated stack of layers of claim 1, in which:

continuous metalization is provided by each trace, the conducting material extending through each hole to said trace, and the terminal connected to said hole; and such continuous metalization is formed on the cap layer prior to its inclusion in the stack.

6. The integrated stack of layers of claim 1, in which the conducting material in each hole in the cap layer fills the hole.

7. The integrated stack of layers of claim 1, in which:

each terminal is located adjacent to a separate hole in the cap layer.

8. The integrated stack of layers of claim 1, in which:

each terminal is connected to a separate hole by a separate conductor.

9. The integrated stack of layers of claim 1 in which the area of the cap layer fits into the same area as the stack of IC chips.

10. The integrated stack of layers of claim 1 in which the IC chips in the stack are secured in planar engagement with one another.

11. The integrated stack of layers of claim 10 in which the cap layer is secured in planar engagement with the stack of IC chips.

12. An integrated stack of layers which form a three dimensional structure having an access plane, and containing embedded integrated circuitry (IC), comprising:

a plurality of layers which are IC chips, each IC Chip extending to the access plane, and each having a multiplicity of electrical leads at the access plane;

a cap layer at one end of the stack, which constitutes an insulating layer and which is not an IC chip;

terminals on the outer surface of the cap layer which are adapted to be connected to external circuitry;

conductors on the access plane which form T-connects with the electrical leads on the IC chip layers; and flat metallic conductors on the cap layer which contact the conductors on the access plane and which lead to the respective terminals on the outer surface of the cap layer.

13. The integrated stack of layers of claim 12, in which:

the cap layer has a plurality of holes extending from its inner surface to its outer surface; and the conductors on the cap layer comprise (a) traces next to the inner surface of the cap layer, each of which leads from one of the holes to a conductor on the access plane of the stack; and (b) conductors which extend through the holes in the cap layer, each connecting to one of the traces.

14. The integrated stack of layers of claim 13, in which:

the terminals are located in groups near edges of the cap layer; and separate conductors on the outer surface of the cap layer lead from separate holes to separate terminals.

15. The integrated stack of layers of claim 12 in which the area of the cap layer fits into the same area as the stack of IC chips.

16. The integrated stack of layers of claim 12 in which the IC chips in the stack are secured in planar engagement with one another.

17. The integrated stack of layers of claim 16 in which the cap layer is secured in planar engagement with the stack of IC chips.

18. The method of fabricating an electronic package which comprises:

stacking and securing together a plurality of IC chips, each chip having embedded IC circuitry and each having leads which extend to the chip edge, the lead-carrying edges of the chips constituting a stack access plane;

forming an insulated end layer having a flat inner surface and a flat outer surface;

forming holes extending through the end layer;

forming conductors next to the inner surface of the end layer, each of which is adapted to connect a hole to the access plane of the stack;

forming terminals on the outer surface of the end layer, each of which terminals is connected to a hole;

forming conductors which extend through the holes in the end layer, in order to provide continuous electrical conduction from each terminal to the access plane of the stack;

combining the end layer with the plurality of IC chips; and forming an integrated stack which includes the end layer.

19. The method of claim 18, in which:

the conductors fill the holes in the end layer, in order to prevent flow of material through the holes.

20. The method of claim 18, in which:

the terminals on the outer surface of the end layer are formed near edges of the end layer; and conductors are formed on the outer surface of the end layer connecting the terminals to the holes.

* * * * *